(12) United States Patent
Heineck et al.

(10) Patent No.: US 6,423,607 B1
(45) Date of Patent: Jul. 23, 2002

(54) TRENCH CAPACITOR WITH INSULATION COLLAR AND CORRESPONDING FABRICATION METHOD

(75) Inventors: Lars-Peter Heineck; Tobias Jacobs, both of Paris (FR)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/404,494

(22) Filed: Sep. 23, 1999

(30) Foreign Application Priority Data

Sep. 23, 1998 (DE) .......................... 198 43 641

(51) Int. Cl.[7] .............................................. H01L 21/20
(52) U.S. Cl. ...................... 438/386; 438/243
(58) Field of Search ......................... 438/243, 244, 438/245, 246, 247, 427, 386, 387, 388, 389, 672

(56) References Cited

U.S. PATENT DOCUMENTS

| | | | |
|---|---|---|---|
| 4,794,434 A | | 12/1988 | Pelley, III |
| 5,360,758 A | * | 11/1994 | Bronner et al. ............. 438/243 |
| 5,512,767 A | * | 4/1996 | Noble, Jr. .................. 257/301 |
| 5,543,348 A | * | 8/1996 | Hammer et al. ............ 438/249 |
| 5,545,583 A | * | 8/1996 | Lam et al. .................. 438/386 |
| 5,753,526 A | * | 5/1998 | Ozaki ........................ 438/246 |
| 6,200,873 B1 | * | 3/2001 | Shrems et al. ............. 438/386 |

FOREIGN PATENT DOCUMENTS

| | | |
|---|---|---|
| EP | 0 550 894 A1 | 7/1993 |
| EP | 0 644 591 A1 | 3/1995 |
| EP | 0 782 186 A2 | 7/1997 |
| EP | 0 791 959 A1 | 8/1997 |

OTHER PUBLICATIONS

Nesbit et al.: "A 0.6 $\mu m^2$ 256Mb Trench DRAM Cell With Self–Aligned BuriEd STrap (BEST)" Proceedings of the International Electron Devices Meeting, US, New York, IEEE, 1993, pp. 627–630, XP000481694, ISBN: 0–7803–1451–4.

* cited by examiner

Primary Examiner—David Nelms
Assistant Examiner—David Nhu
(74) Attorney, Agent, or Firm—Laurence A. Greenberg; Werner H. Stemer; Gregory L. Mayback

(57) ABSTRACT

The trench capacitor, which is particularly suited for use in a semiconductor memory cell, is formed in a trench in a substrate. A region in the substrate defines a first capacitor plate. An insulation collar is formed in the upper region of the trench. A dielectric layer on the trench wall forms a capacitor dielectric. A conductive filling material fills the trench and forms a second capacitor plate. The dielectric layer at least partly surrounds the insulation collar. The invention furthermore provides a corresponding fabrication method.

13 Claims, 6 Drawing Sheets

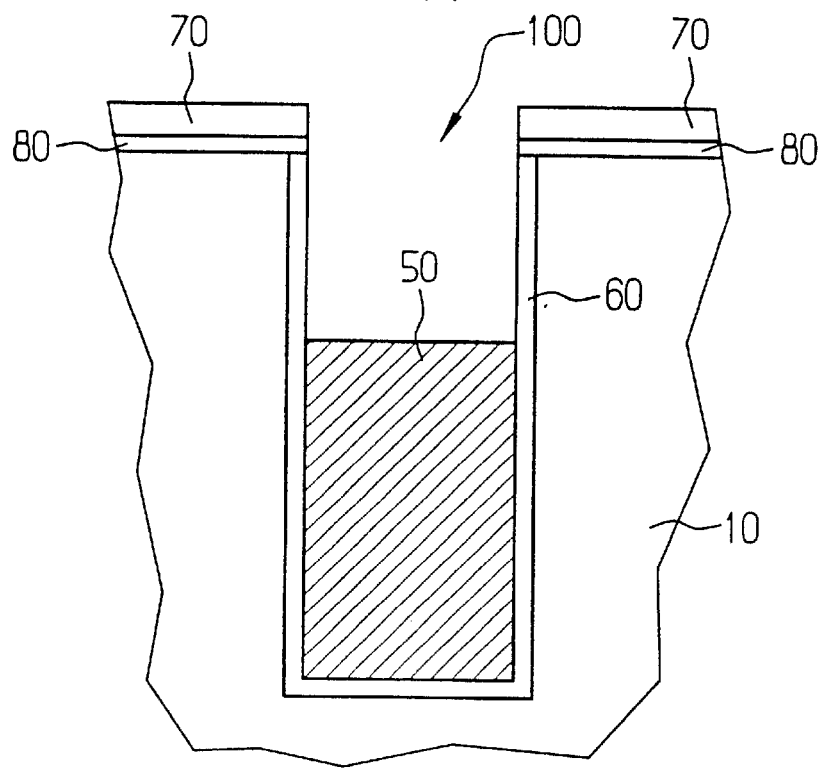
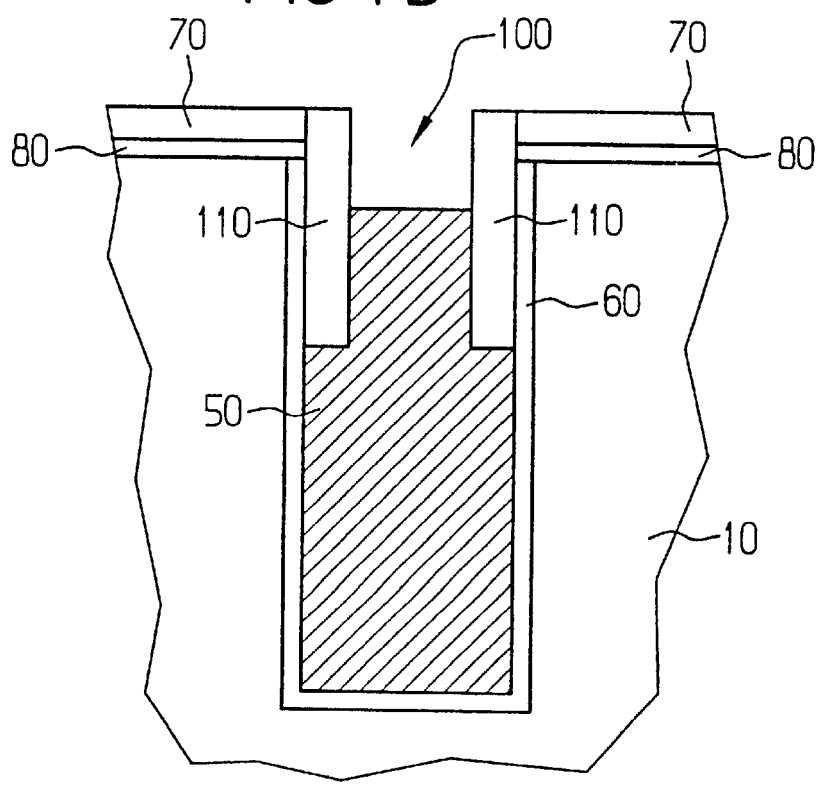

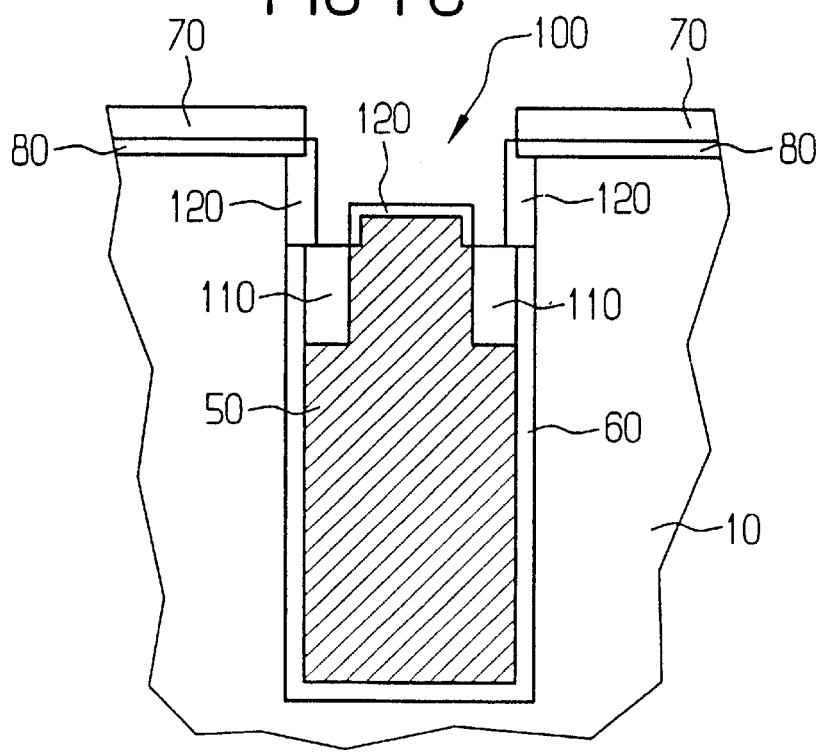
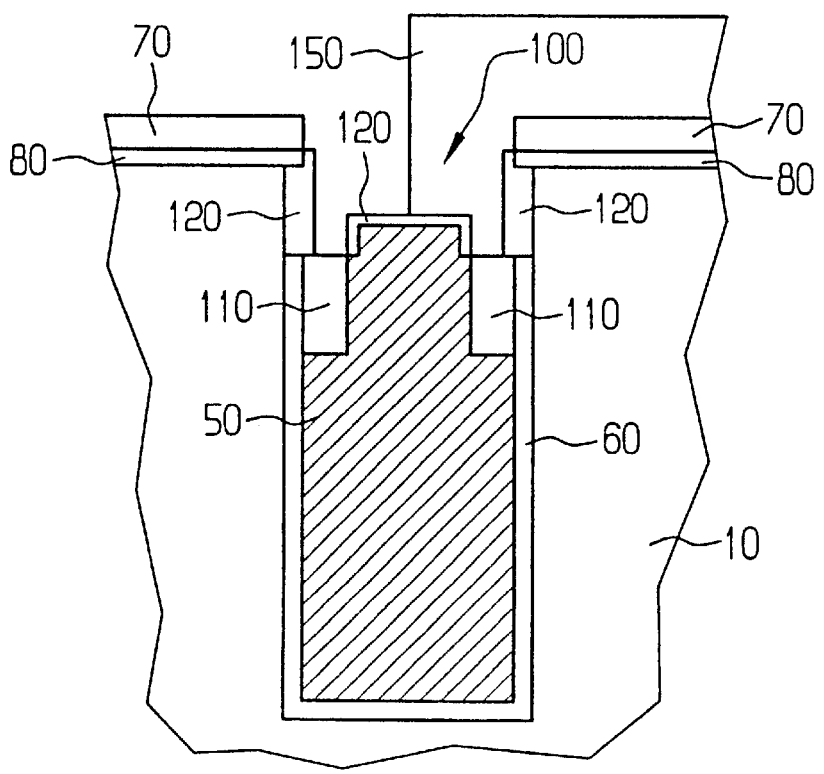

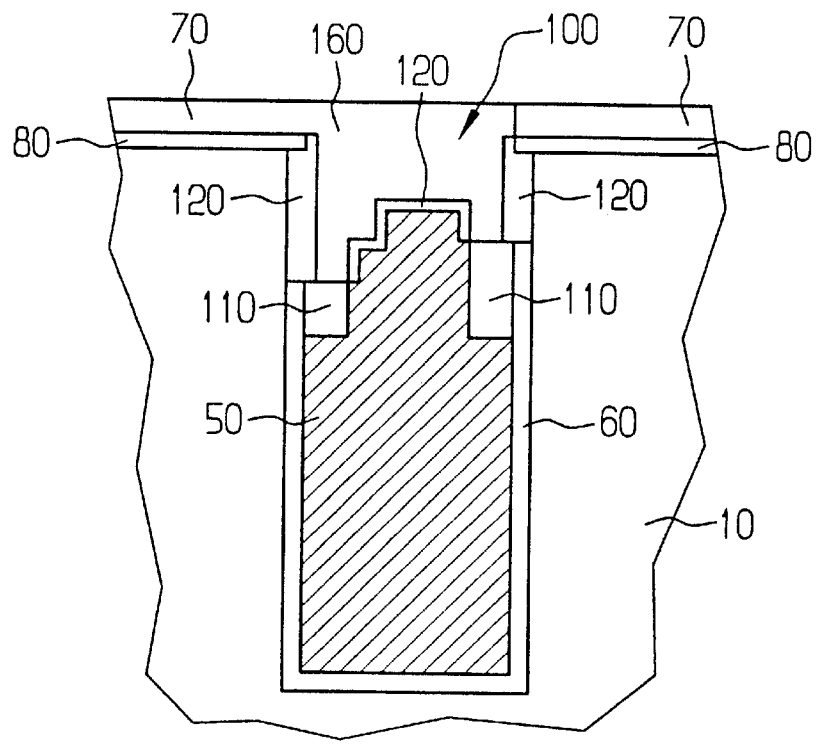
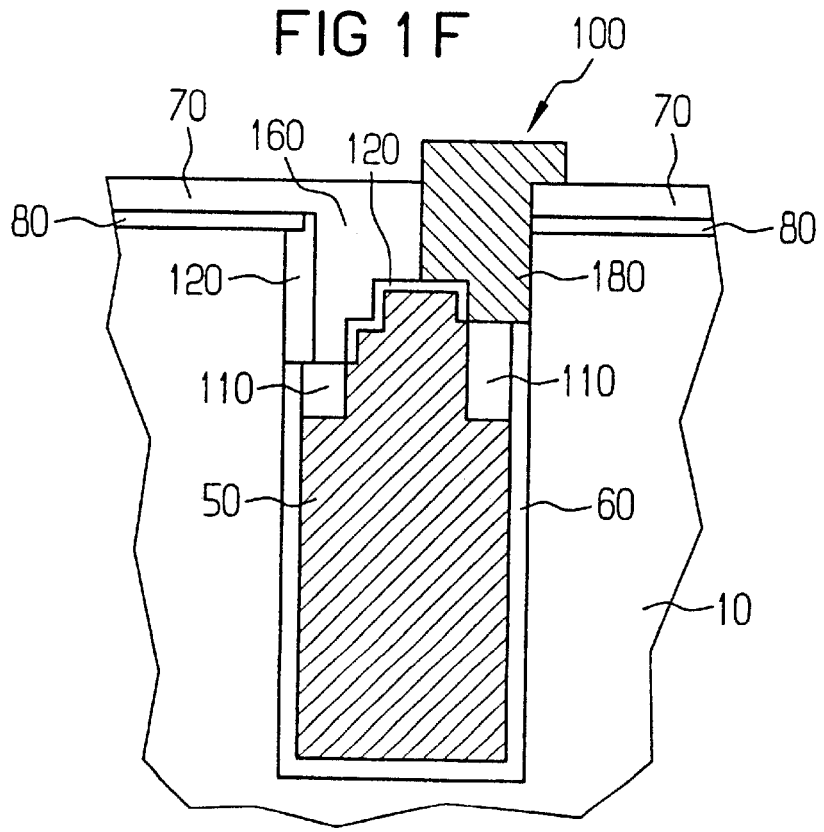

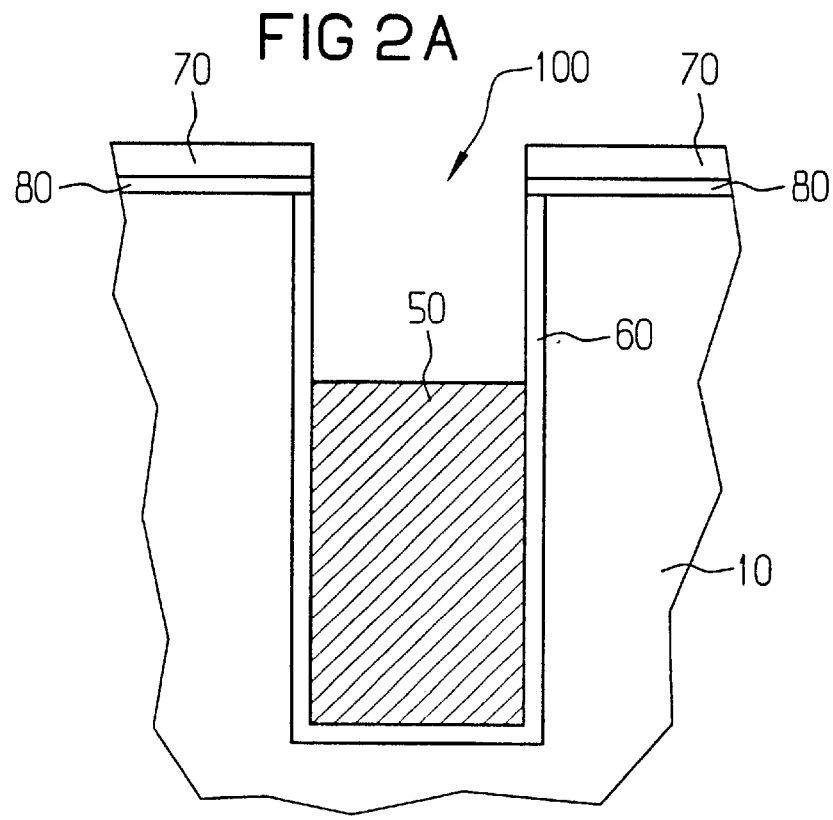
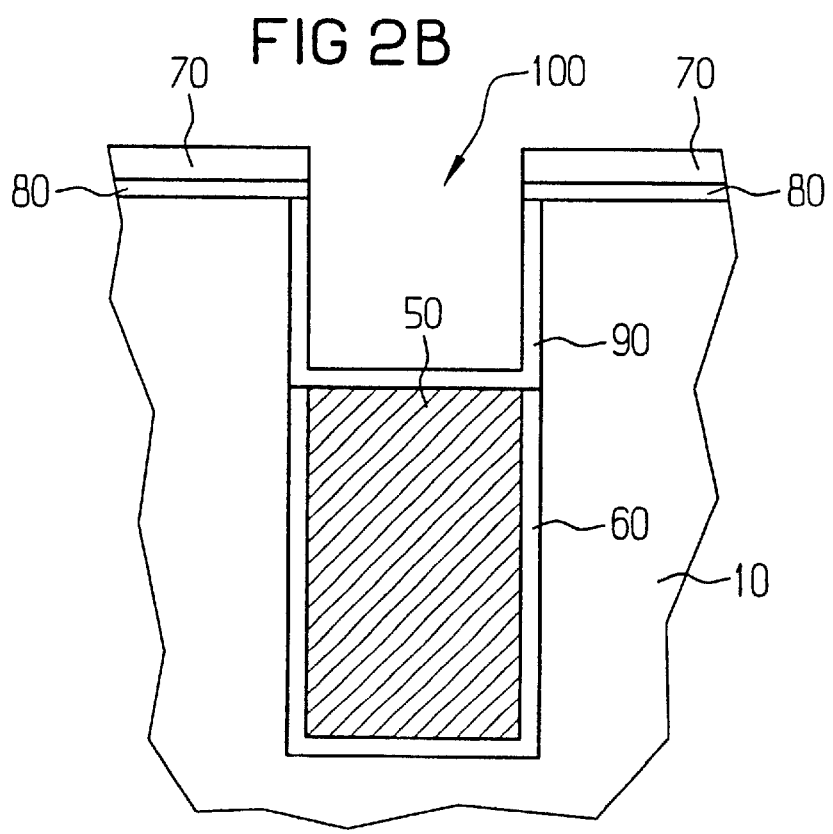

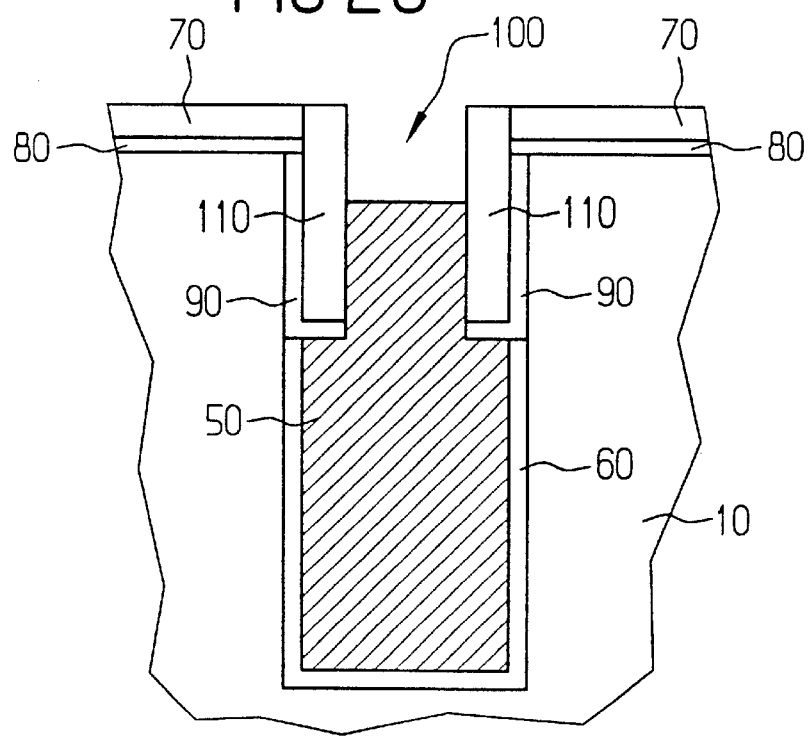
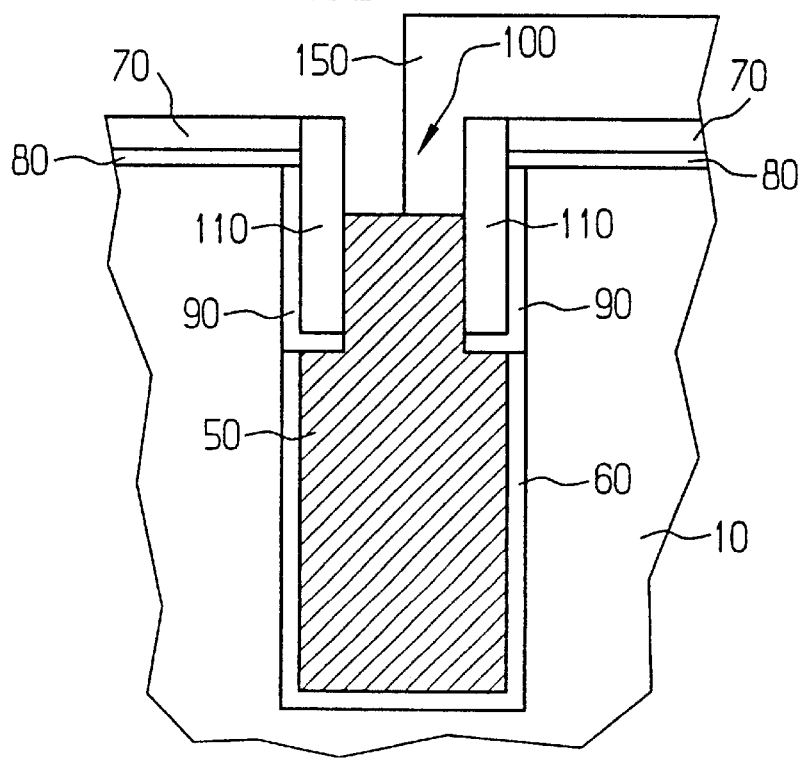

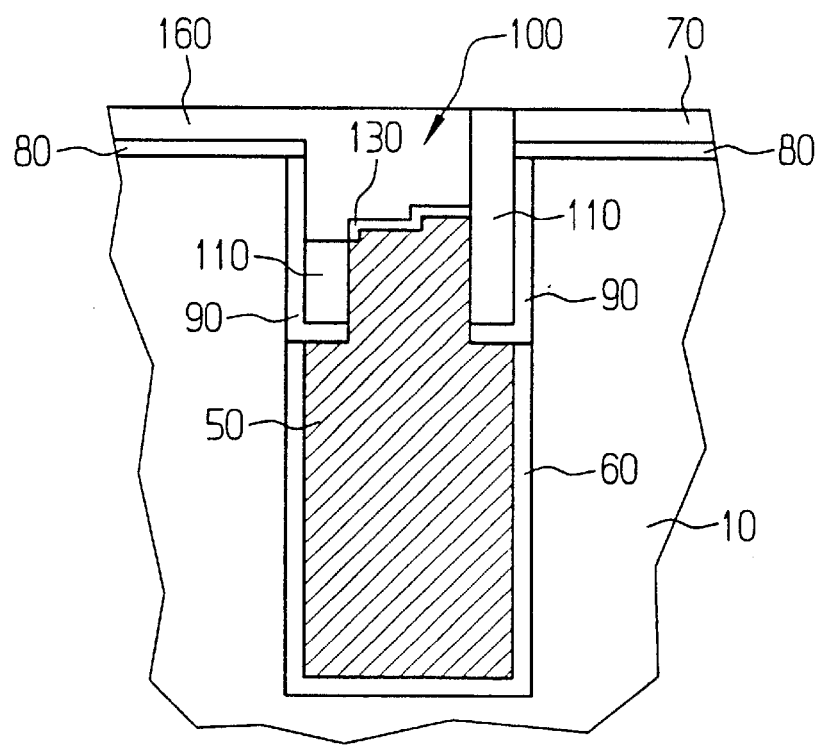
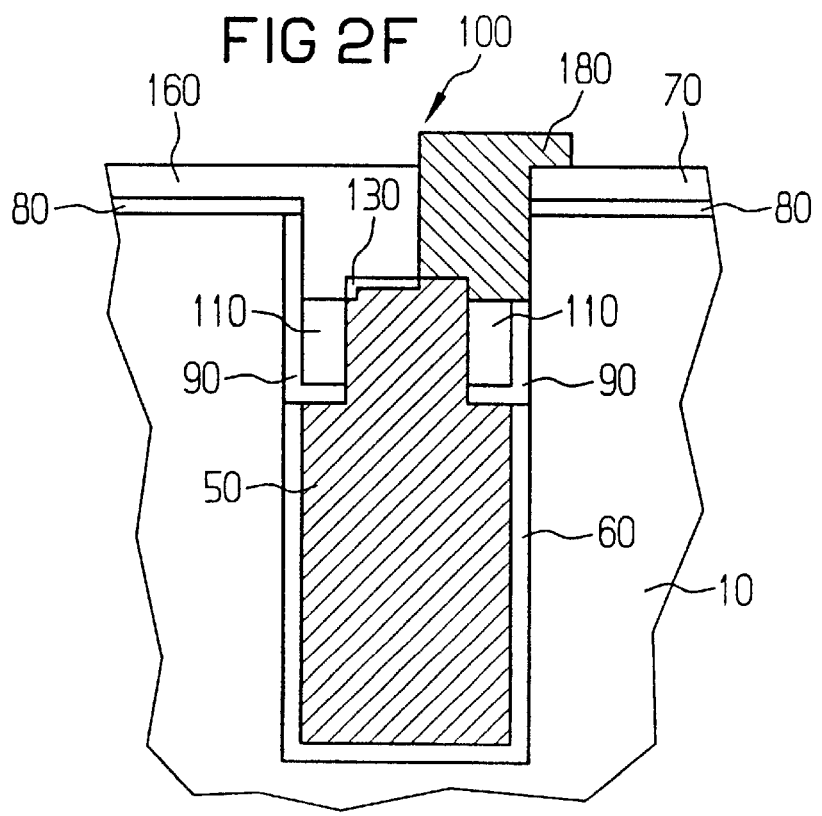

TRENCH CAPACITOR WITH INSULATION COLLAR AND CORRESPONDING FABRICATION METHOD

BACKGROUND OF THE INVENTION

1. Field of the Invention

The present invention relates to a trench capacitor having an insulation collar and a corresponding fabrication method.

2. Description of the Related Art

Integrated circuits (ICs) or chips use capacitors for the purpose of storing charge. One example of an IC which uses capacitors to store charges is a memory IC, such as, for example, a chip for a dynamic read/write memory with random access (DRAM). The charge state ("0" or "1") in the capacitor represents a data bit in this case.

A DRAM chip contains a matrix of memory cells which are connected up in rows and columns. The row connections are usually referred to as word lines and the column connections as bit lines. The reading of data from the memory cells or the writing of data to the memory cells is realized by activating suitable word lines and bit lines.

A DRAM memory cell usually contains a transistor connected to a capacitor. The transistor contains two diffusion regions separated by a channel above which a gate is arranged. Depending on the direction of the current flow, one diffusion region is referred to as the drain and the other as the source. The designations "drain" and "source" are used mutually interchangeably here with regard to the diffusion regions. The gates are connected to a word line, and one of the diffusion regions is connected to a bit line. The other diffusion region is connected to the capacitor. The application of a suitable voltage to the gate switches the transistor on and enables a current flow between the diffusion regions through the channel in order thus to form a connection between the capacitor and the bit line. The switching-off of the transistor disconnects this connection by interrupting the current flow through the channel.

The charge stored in the capacitor decreases with time on account of an inherent leakage current. Before the charge has decreased to an indefinite level (below a threshold value), the storage capacitor must be refreshed.

Ongoing endeavors to reduce the size of storage devices foster the design of DRAMs that have a greater density and a smaller characteristic size, that is to say a smaller memory cell area. In order to fabricate memory cells which occupy a smaller surface region, smaller components, for example capacitors, are used. However, the use of smaller capacitors results in a reduced storage capacitance, which, in turn, can adversely affect the functionality and usability of the storage device. For example, sense amplifiers require a sufficient signal level for reliable read-out of the information in the memory cells. The ratio of the storage capacitance to the bit line capacitance is critical in determining the signal level. If the storage capacitance becomes too small, this ratio may be too small to generate a sufficient signal. Likewise, a smaller storage capacitance requires a higher refresh frequency.

One type of capacitor usually used in DRAMs is a trench capacitor. A trench capacitor has a three-dimensional structure formed in the silicon substrate. An increase in the volume or the capacitance of the trench capacitor can be achieved by etching more deeply into the substrate. In that case, an increase in the capacitance of the trench capacitor does not have the effect of enlarging the surface occupied by the memory cell.

A customary trench capacitor contains a trench etched into the substrate. The trench is typically filled with $p^+$- or $n^+$-doped polysilicon, which serves as one capacitor electrode (also referred to as storage capacitor). The second capacitor electrode is the substrate or a "buried plate." A capacitor dielectric containing nitride, for example, is usually used to insulate the two capacitor electrodes.

A dielectric collar (preferably an oxide region) is produced in the upper region of the trench in order to prevent a leakage current or to insulate the upper part of the capacitor.

The capacitor dielectric in the upper region of the trench, where the collar is to be formed, is usually removed before the collar is formed, since the upper part of the capacitor dielectric is a hindrance to subsequent process steps.

In particular, this makes the etching of the gate interconnect more difficult, since the capacitor dielectric shields parts of the previously deposited gate polysilicon from the etching, which entails the risk of a short circuit between the gate interconnect and the trench capacitor.

Furthermore, the integration of the strap with respect to the transistor is made considerably more difficult if the capacitor dielectric is preserved on the trench sidewall. In that case, the contact area with respect to the drain diffusion region of the transistor is greatly reduced, which entails an increased contact resistance and corresponding resultant problems for the operation of the memory.

Finally, protruding capacitor dielectric promotes the formation of defects and dislocations, and, for example, pinholes are easily formed at the transition between the lower part of the collar and the upper part of the capacitor dielectric in the course of the subsequent high-temperature processes. Such imperfections impair the quality of the capacitor dielectric and are a significant source for the reduction of charge from the trench. This reduces the retention time of the trench capacitor and, consequently, adversely affects its functionality.

In order to circumvent these problems, the upper part of the capacitor dielectric should be removed, but only to an extent that is absolutely necessary, since the capacitor dielectric also advantageously serves as insulator and diffusion barrier.

SUMMARY OF THE INVENTION

It is accordingly an object of the invention to provide a trench capacitor with an insulation collar, which overcomes the above-mentioned disadvantages of the heretofore-known devices and methods of this general type and which provides an improved trench capacitor with an insulation collar in which the capacitor dielectric is removed only down to the necessary depth, rather than over the entire depth of the collar. It is a further object of the invention to provide a corresponding fabrication method.

With the foregoing and other objects in view there is provided, in accordance with the invention, a trench capacitor, particularly in a semiconductor memory, comprising:

a substrate having a trench formed therein with a trench wall and an upper region;

a region in the substrate defined as a first capacitor plate;

a dielectric layer on the trench wall defining a capacitor dielectric;

a conductive filling material, filled in the trench, defining a second capacitor plate; and an insulation collar formed in the upper region of the trench;

whereby the dielectric layer surrounds the insulation collar at least partly.

In accordance with an added feature of the invention, a capacitor connection region is provided in the trench, and the dielectric layer is removed down to a depth of the capacitor connection region.

In accordance with an additional feature of the invention, an insulation trench region is provided in the trench, and the dielectric layer is removed down to a depth of the insulation trench region.

In accordance with a concomitant feature of the invention, the dielectric layer includes one or more oxide and nitride layers.

With the above and other objects in view there is provided, in accordance with the invention, a method for fabricating a trench capacitor, particularly for a semiconductor memory cell, which comprises the following steps:

forming a trench with trench walls, a lower region, and an upper region, in a substrate having a region serving as a first capacitor plate;

forming a first dielectric layer constituting a capacitor dielectric on the trench walls;

filling a lower region of the trench with a filling material in the lower region, the filling material constituting a second capacitor plate;

forming an insulation collar in the upper region of the trench on the first dielectric layer; and filling the upper region of the trench with filling material.

In accordance with another mode of the invention, the insulation collar is formed from an oxide layer.

In accordance with again a further mode of the invention, a part of the insulation collar and of the first dielectric layer situated underneath is selectively removed in the upper region of the trench.

In accordance with again an added feature of the invention, a second dielectric layer is provided in a region where the insulation collar has been removed and on the filling material in the upper region of the trench.

In accordance with again an additional feature of the invention, an insulation trench region is formed in the upper region of the trench on the insulation collar and, if appropriate, on the second dielectric layer.

In accordance with again another feature of the invention, a capacitor connection region is provided in the region where the insulation collar has been removed and on the filling material in the upper region of the trench.

In accordance with again a further feature of the invention, an insulation trench region is provided in the upper region of the trench.

In accordance with a concomitant feature of the invention, the capacitor connection region is removed during the formation of the insulation trench region.

The idea on which the present invention is based is for the capacitor dielectric to be removed only where absolutely necessary, that is to say in the capacitor connection region. It may be necessary to remove the capacitor dielectric in the insulation trench region as well, due to the dictates of the fabrication process. This removal is achieved by introducing an insulation collar etching step after the sinking of the second polysilicon. In other words, the capacitor dielectric or the ONO layer is removed wherever the originally applied insulation collar, which is preferably composed of TEOS oxide, is also removed, with the result that the dielectric layer at least partly surrounds the insulation collar.

The method according to the invention has the advantage over the prior art approaches of being associated with considerable savings in respect of costs and time as a result of the insulation collar etching step being carried out after the sinking of the second polysilicon, that is to say at a later point in time compared with the prior art process. Moreover, problems at the interface between the two polysilicon fillings are considerably reduced.

A significant advantage of this procedure is the elimination of the disintegration of the successive processes of sinking-in etching of the polysilicon, the deposition of the collar oxide and etching of the collar, as prevails in the customary process. The process speed rises considerably as a result of this.

Other features which are considered as characteristic for the invention are set forth in the appended claims.

Although the invention is illustrated and described herein as embodied in a trench capacitor with insulation collar and corresponding fabrication method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1A–1F are diagrammatic sectional views illustrating a sequence of those method steps for fabricating an exemplary embodiment of the trench capacitor according to the invention which are essential for understanding the invention; and FIGS. 2A–2F are diagrammatic sectional views illustrating a sequence of method steps for fabricating a customary trench capacitor which are essential for understanding the problems on which the invention is based.

DESCRIPTION OF THE PREFERRED EMBODIMENTS

Although applicable to any desired trench capacitors, the present invention and the problems on which it is based will be explained below with regard to a trench capacitor used in a DRAM memory cell. Such memory cells are used in integrated circuits (ICs), such as, for example, random access memories (RAMs), dynamic RAMs (DRAMs), synchronous DRAMs (SDRAMs), static RAMs (SRAMs) and read-only memories (ROMs). Other integrated circuits contain logic devices, such as, for example, programmable logic arrays (PLAs), application-specific ICs (ASICs), mixed logic/memory ICs (embedded DRAMs) or other circuit devices. It is usual for a multiplicity of ICs to be fabricated in parallel on a semiconductor substrate, such as, for example, a silicon wafer. After processing, the wafer is divided in order to separate the ICs into a multiplicity of individual chips (the severing operation is referred to as dicing). The chips are then packaged into end products, for example for use in consumer products such as, for example, computer systems, cellular telephones, personal digital assistants (PDAs) and further products. For discussion purposes, the invention will be described with regard to the formation of an individual memory cell.

A description of the fabrication of a prior art trench capacitor, fabricated in a single-stage etching process, for a DRAM memory cell precedes the description of the invention.

In general, the trench capacitor is formed in a substrate 10. The substrate is lightly doped with p-type dopants ($p^-$), such as, for example, boron (B). The trench 100 is usually filled with polysilicon 50 doped with n-type dopants (n$^+$), such as, for example, arsenic (As) or phosphorus (P). A non-illustrated buried plate doped with As, for example, is optionally provided in the substrate 10 in the vicinity of the lower region of the trench 100. The arsenic is diffused into the silicon substrate 10 from a dopant source, such as ASG for example, which is formed on the sidewalls of the trench 100. The polysilicon 50 and the buried plate or the substrate 10 serve as the capacitor electrodes. The capacitor dielectric 60 separates these capacitor electrodes.

A DRAM memory cell that uses the trench capacitor likewise has a non-illustrated transistor. The transistor comprises a gate and also diffusion regions. The diffusion regions, which are separated by a channel, are formed by the implantation of n-type dopants, such as, for example, phosphorus (P). A capacitor connection diffusion region, which is designated as "capacitor connection" connects the trench capacitor to the transistor. The capacitor connection diffusion region is formed by outdiffusion of dopants from the trench polysilicon through a strap (plug strap or buried strap).

The above-mentioned collar is formed on the upper region of the trench 100. The upper region of the trench 100 means the portion which contains the collar, and the lower region of the trench 100 means the portion below the collar. The collar prevents a leakage current of the capacitor connection to the buried plate or to the substrate. The leakage current is undesirable because it impairs the retention time of the memory cell, which increases the refresh frequency and therefore adversely affects the functionality.

The activation of the transistor by the application of suitable voltages to the gate and the bit line creates a connection to the trench capacitor. In general, the gate is connected to a word line, and the diffusion region is connected to a bit line in the DRAM matrix via a contact. The bit line is insulated from the diffusion regions by means of an interposed dielectric intermediate layer.

A narrow insulation trench (STI isolation) is provided in order to insulate the DRAM memory cell with the trench capacitor from other memory cells or other electrical devices.

FIGS. 2A–2E show the method steps for fabricating the customary trench capacitor which are essential for understanding the problems on which the invention is based.

With reference to FIG. 2A, a substructure stack is formed on the surface of the substrate 10. The substructure stack comprises a plurality of different layers, in particular a substructure nitride layer 70 and a substructure oxide layer 80. The substructure stack is patterned using customary photolithographic techniques, in order to define a region in which the trench 100 is to be formed. Reactive ion etching is carried out in order to form the trench 100.

An oxide-nitride-oxide layer 60 is subsequently provided on the trench walls, the layer serving as the capacitor dielectric. The capacitor dielectric layer 60 isolates the capacitor electrodes. By way of example, the capacitor dielectric layer 60 may also comprise nitride or nitride/oxide instead of oxide/nitride/oxide or another dielectric layer or another stack of dielectric layers.

A polysilicon semiconductor layer 50 is then deposited over the wafer in order to fill the trench 100. Amorphous silicon can likewise be used. Further types of material which have temperature stability up to 1050 to 1100° C. and can be removed selectively with respect to nitride or oxide can likewise be used.

As further shown in FIG. 2A, the polysilicon 50 is then removed down to the underside of the collar to be formed. The removal of the polysilicon 50 comprises, by way of example, planarization by means of chemical mechanical polishing, chemical dry etching (CDE) or reactive ion etching for the purpose of forming a coplanar surface with the top side of the polysilicon in the trench 100. Reactive ion etching is then carried out in order to sink the polysilicon 50 in the trench 100. The use of chemical dry etching to lower the polysilicon 50 in the trench 100 is likewise possible.

As shown in FIG. 2B, a dielectric layer is then deposited over the wafer and covers the substructure stack and the trench sidewalls. The dielectric layer is used to form the collar.

The dielectric layer is made of oxide, for example. In the present embodiment, the dielectric layer is formed by the growth of a layer of thermal oxide 90 and the subsequent deposition of an oxide layer 110 using TEOS. The oxide can be densified by a heat-treatment step. The oxide layer is thick enough to avoid a vertical leakage current, namely 10–50 nm. As an alternative, the dielectric layer may have just a layer of thermal oxide.

In another embodiment, the dielectric layer is formed from CVD oxide. After the CVD oxide has been formed, a heat-treatment step may be carried out in order to densify the oxide. The heat-treatment step is carried out for example in Ar, $N_2$, $O_2$, $H_2O$, $N_2O$, NO or $NH_3$ atmosphere. An oxidizing atmosphere, such as $O_2$ or $H_2O$, for example, can be used to form a thermal oxide layer under the CVD oxide. Oxygen from the atmosphere then diffuses through the CVD oxide to form a thermal oxide layer on the substrate surface. This advantageously enables the formation of a thermal oxide, if desired, without the need for a thermal oxidation step prior to the deposition of the CVD oxide. The heat-treatment step is typically carried out at a temperature of about 1000–1100° C. and for about 0.5–3 hours.

Furthermore with reference to FIG. 2C, the dielectric layer is etched by reactive ion etching, for example, in order to form the collar per se and to uncover the polysilicon 50 in the trench.

Afterwards, polysilicon is deposited for a second time, in order to fill the trench 100, and the polysilicon 50 is etched back for a second time, to the level shown in FIG. 2C. With reference to FIG. 2D, a photoresist layer 150 is then applied and patterned in such a way that the left-hand half of the trench is uncovered in each case.

There then follow an insulation trench etching step, and filling and planarization of the insulation trench with TEOS oxide 160, a thermal oxide 130 additionally being formed on the top side of the polysilicon filling 50. The structure shown in FIG. 2E is thus obtained.

Subsequently, with reference to FIG. 2F, a capacitor connection region 180 is then formed in the right-hand half of the trench 100 as a strap with respect to the transistor or another integrated circuit element. This is achieved by etching for the purpose of sinking the upper insulation in the trench and the subsequent deposition and patterning of polysilicon. Reactive ion etching is typically used for this purpose.

The further process steps are well known in the prior art and, therefore, are not explained in any more detail here.

What is important for the present invention is that the capacitor dielectric 60 is removed after the first process of sinking the polysilicon 50 (see FIG. 2B) to the extent of the full height of the collar, which is subsequently deposited and patterned.

Significant disadvantages of this process are disintegration of the successive processes of sinking-in etching of the polysilicon 50, deposition of the collar oxide and etching of the collar. The process speed decreases considerably as a result of this. In addition, the chemicals used to remove the ONO layer 60 leave behind residues which necessitate further cleaning steps.

The thermal oxidation, carried out after the removal of the capacitor dielectric 60, for the purpose of producing a stable interface between the trench sidewall and the collar simultaneously leads to the formation of a thermal oxide layer on the first polysilicon 50. This makes it more difficult to etch the collar, since the oxide must be completely removed before the deposition of the second polysilicon 50 in order to avoid the risk of the formation of an insulating interface remaining between the two polysilicon fillings. This latter situation would bring about a reduced capacitance or even complete failure of the capacitor.

Consequently, an additional wet etching step, preferably a DHF step, must be carried out in order to remove the thermal oxide layer on the first polysilicon 50; this etching step also attacks the collar oxide. Consequently, it is necessary in turn to deposit a thicker collar oxide, which is associated with poorer process control.

Finally, this makes it necessary to introduce an additional collar oxide annealing step in order to minimize the wet etching attack on the sidewall of the collar and in order to improve the uniformity of the etching of the collar oxide; this has a disadvantageous effect on the process time and the process costs.

FIGS. 1A–1F show the method steps for fabricating an exemplary embodiment of the trench capacitor according to the invention which are essential for understanding the invention, by analogy with FIGS. 2A–2F.

The steps which are necessary to reach the process stage shown in FIG. 1A correspond to those which have been explained above with reference to FIG. 2A.

The removal of the capacitor dielectric in the form of the oxide-nitride-oxide layer 60 in this process stage is omitted, however, in this embodiment of the invention, and instead of this the insulation collar 110 is provided in the form of the TEOS oxide layer in the upper part of the trench 100.

As shown in FIG. 1B, the second polysilicon filling is then effected and it is sunk below the substrate surface.

In accordance with FIG. 1C, the capacitor dielectric 60 is removed in the upper region of the trench 100, after the insulation collar 110 has been etched back to the desired depth beforehand. This etching back can be effected for example by means of a simple wet-chemical etching, for example using BHF, in which case it is almost exclusively the oxide that is etched, while the substructure nitride 70 and the polysilicon filling 50 are virtually not attacked. The oxide-nitride-oxide layer 60 is expediently removed using HF/glycerol or HF/ethylene-glycerol.

There then follow the standard cleaning steps. In addition, a thin thermal oxidation for forming the oxide layer 120 may also be effected in order to protect the trench sidewall in the upper region of the trench 100 against contamination by photoresist in the subsequent process step in accordance with FIG. 1D.

In the further process steps shown in FIGS. 1D–1F, essentially no process changes are necessary. After the photoresist patterning in accordance with FIG. 1D, an insulation trench is etched in the left-hand trench half, and after the removal of the photoresist, a further thermal oxidation is effected which provides additional sealing of the trench sidewall. The subsequent deposition of a TEOS oxide fills the gap resulting from the etching back of the insulation collar.

In the right-hand trench half, the capacitor connection region 180 is then formed in the region where the insulation collar 110 has been removed and on the filling material in the upper region of the trench (100), after the trench oxide has been removed there.

Although the present invention has been described above using a preferred exemplary embodiment. Rather, those of skill in the pertinent art will readily understand that the invention is not restricted to the exemplary embodiment but can be modified in diverse ways.

In particular, the materials referred to are only by way of example and can be replaced by other materials having suitable properties. The same applies to the etching processes and deposition processes mentioned.

Specifically, the capacitor dielectric may be an ON, NO, ONO or another suitable insulation layer.

We claim:

1. A method for fabricating a trench capacitor, which comprises the following steps:

forming a trench with trench walls, a lower region, and an upper region, in a substrate having a region serving as a first capacitor plate;

forming of a first dielectric layer constituting a capacitor dielectric on the trench walls;

filing the lower region of the trench with a filling material, the filling material constituting a second capacitor plate;

forming an insulation collar in the upper region of the trench on the first dielectric layer;

filling the upper region of the trench with filling material and sinking the filling material below the substrate surface;

selectively removing part of the insulation collar and of the first dielectric layer located laterally next to the insulation collar in the upper region of the trench;

forming an insulation trench in a first trench half on the insulation collar and the filling material in the upper region of the trench, and during the formation of the insulation trench, removing a part of the insulation collar and of the first dielectric layer located laterally next to the insulation collar in the upper region of the trench;

filling the insulation trench with a dielectric; and forming a capacitor connection region in a second trench half on the insulation collar and the filling material in the upper region of the trench, and, during the formation of the capacitor connection region, removing a part of the insulation collar and of the first dielectric layer located laterally next to the insulation collar in the upper region of the trench as well as a part of the dielectric of the insulation trench.

2. The method according to claim 1, wherein the dielectric layer is removed down to the depth of an capacitor connection region provided in the trench.

3. The method according to claim 1, wherein the dielectric layer is removed down to the depth of the insulation trench provided in the trench.

4. The method according to claim 2, wherein the dielectric layer is removed down to the depth of the insulation trench provided in the trench.

5. The method according to claim 1, wherein the dielectric layer has one or more oxide and nitride layers.

6. The method according to claim 2, wherein the dielectric layer has one or more oxide and nitride layers.

7. The method according to claim 3, wherein the dielectric layer has one or more oxide and nitride layers.

8. The method according to claim 1, wherein the insulation collar is formed from an oxide layer.

9. The method according to claim 2, wherein the insulation collar is formed from an oxide layer.

10. The method according to claim 3, wherein the insulation collar is formed from an oxide layer.

11. The method according to claim 1, further comprising the step of providing a second dielectric layer in the region where the insulation collar has been removed and on the filling material in the upper region of the trench prior to forming the insulation trench.

12. The method according to claim 2, further comprising the step of providing a second dielectric layer in the region where the insulation collar has been removed and on the filling material in the upper region of the trench prior to forming the insulation trench.

13. The method according to claim 3, further comprising the step of providing a second dielectric layer in the region where the insulation collar has been removed and on the filling material in the upper region of the trench prior to forming the insulation trench.

* * * * *